United States Patent
Hung et al.

(10) Patent No.: US 10,910,706 B2
(45) Date of Patent: Feb. 2, 2021

(54) RADAR SENSOR HOUSING DESIGN

(71) Applicant: MediaTek Inc., Hsinchu (TW)

(72) Inventors: Chih-Ming Hung, San Jose, CA (US); Yu Chun Lu, Hsinchu (TW); Yen-Ju Lu, Hsinchu (TW); ChiaYu Lin, Hsinchu (TW)

(73) Assignee: MediaTek Inc.

( * ) Notice: Subject to any disclaimer, the term of this patent is extended or adjusted under 35 U.S.C. 154(b) by 0 days.

(21) Appl. No.: 16/248,821

(22) Filed: Jan. 16, 2019

(65) Prior Publication Data

US 2019/0229410 A1 Jul. 25, 2019

Related U.S. Application Data

(60) Provisional application No. 62/619,181, filed on Jan. 19, 2018.

(51) Int. Cl.
*H01Q 1/42* (2006.01)
*H05K 1/02* (2006.01)
(Continued)

(52) U.S. Cl.
CPC .............. *H01Q 1/42* (2013.01); *G01S 7/023* (2013.01); *G01S 13/931* (2013.01);
(Continued)

(58) Field of Classification Search
CPC .. G01S 7/023; G01S 13/931; G01S 2007/027; G01S 2007/028;
(Continued)

(56) References Cited

U.S. PATENT DOCUMENTS 4,346,774 A * 8/1982 Hirota ................. B60R 16/0237
  180/167
4,914,448 A * 4/1990 Otsuka ................... H01Q 1/125
  343/700 MS (Continued)

FOREIGN PATENT DOCUMENTS

DE      10248915 A1    4/2004
DE    102012111184 A1    5/2014
EP       2034328 A1    3/2009

OTHER PUBLICATIONS

European Patent Office, Search Report for EP Patent Application No. 19152875.1, Jun. 3, 2019.

*Primary Examiner* — Anatoly Vortman
(74) *Attorney, Agent, or Firm* — Han IP PLLC; Andy M. Han

(57) ABSTRACT

Various examples pertaining to a sensor housing design for millimeter wave (mmWave) sensors are described. A sensor housing may include a radar sensor, a printed circuit board (PCB), a radome and a PCB holder. The radar sensor may be capable of emitting a radio wave. The PCB may have a first side and a second side opposite the first side with the radar sensor mounted on the first side thereof to form a PCB assembly (PCBA). The radome may include a cavity in which the PCBA is disposed. The PCB holder may be disposed along a circumference of an inner wall of the radome, and the PCB holder may be configured to hold the PCBA such that a distance between an inner surface of the (Continued)

radome and a side of the radar sensor facing the inner surface of the radome is proportional to half wavelength of the radio wave.

13 Claims, 8 Drawing Sheets

(51) Int. Cl.
  *G01S 13/93* (2020.01)
  *G01S 7/02* (2006.01)
  *G01S 13/931* (2020.01)
  *H01Q 1/32* (2006.01)
(52) U.S. Cl.
  CPC ........... *H01Q 1/3283* (2013.01); *H01Q 1/421* (2013.01); *H05K 1/023* (2013.01); *H05K 1/0209* (2013.01); *G01S 2007/027* (2013.01); *G01S 2007/028* (2013.01); *G01S 2013/93275* (2020.01); *H05K 2201/10098* (2013.01)
(58) Field of Classification Search
  CPC .......... G01S 2013/9389; H01Q 1/3283; H01Q 1/42; H01Q 1/421; H05K 1/0209; H05K 1/023; H05K 2201/10098
  USPC .......................................... 361/704
  See application file for complete search history.

(56) References Cited

U.S. PATENT DOCUMENTS

| | | | | |
|---|---|---|---|---|
| 5,828,339 | A * | 10/1998 | Patel | H01Q 1/246 343/700 MS |
| 5,831,830 | A * | 11/1998 | Mahler | H01Q 1/02 361/704 |
| 5,977,710 | A * | 11/1999 | Kuramoto | B29C 65/567 343/700 MS |
| 6,452,533 | B1 | 9/2002 | Yamabuchi et al. | |
| 6,600,103 | B1 | 7/2003 | Schmidt et al. | |
| 7,098,842 | B2 * | 8/2006 | Nakazawa | G01S 7/032 342/175 |
| 8,045,329 | B2 * | 10/2011 | Chen | H01Q 1/02 343/872 |
| 2005/0190116 | A1 * | 9/2005 | Syed | H01Q 19/19 343/872 |
| 2008/0252552 | A1 * | 10/2008 | Goebel | H01Q 1/246 343/872 |
| 2010/0194661 | A1 * | 8/2010 | Harokopus | H01Q 1/40 343/872 |
| 2015/0130653 | A1 * | 5/2015 | Shiraishi | G01S 13/04 342/27 |
| 2016/0033621 | A1 | 2/2016 | Ottenhues et al. | |
| 2016/0218420 | A1 | 7/2016 | Leung et al. | |

* cited by examiner

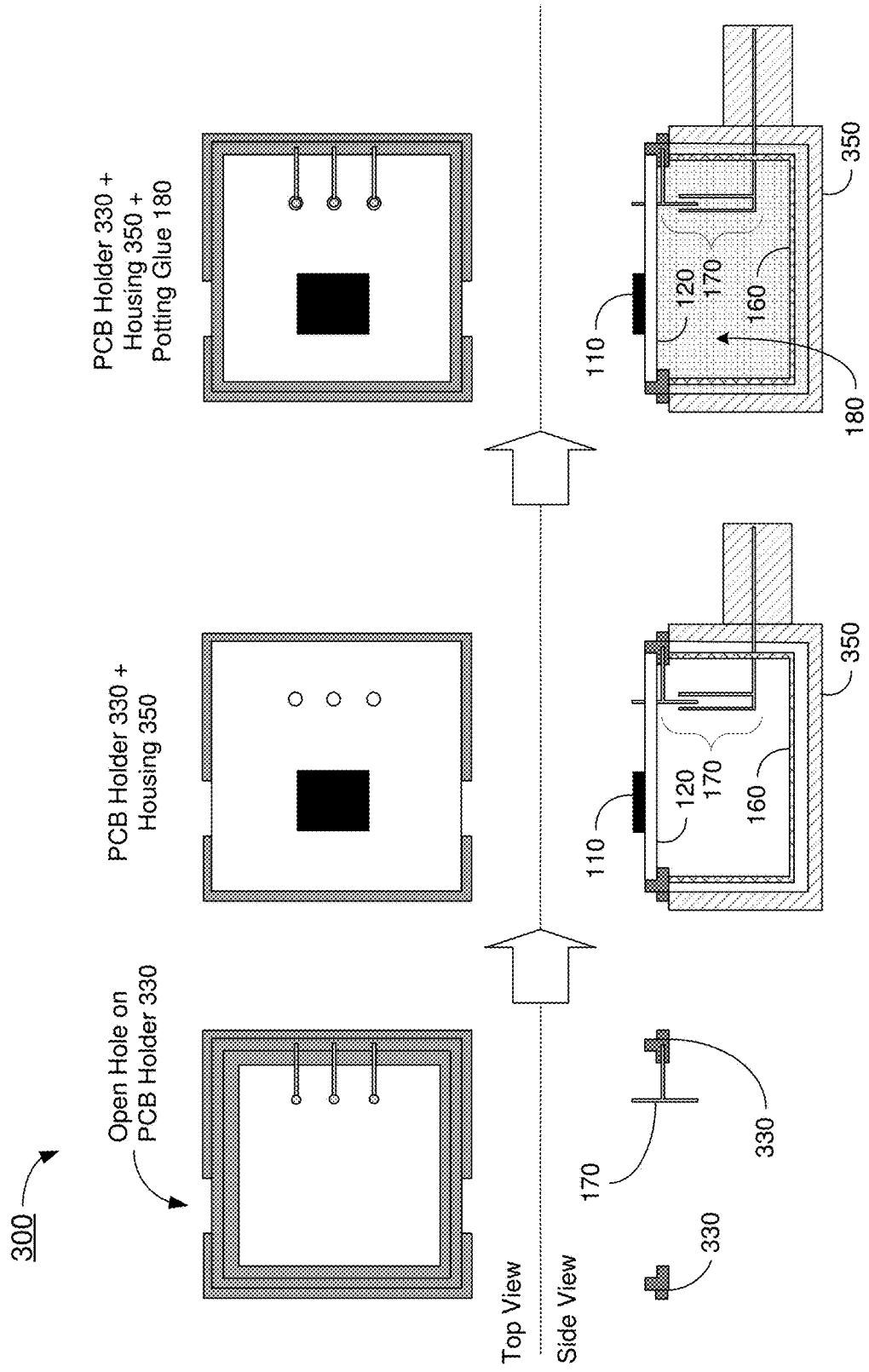

RADAR SENSOR HOUSING DESIGN

CROSS REFERENCE TO RELATED PATENT APPLICATION(S)

The present disclosure is part of a non-provisional application claiming the priority benefit of U.S. Patent Application No. 62/619,181, filed on 19 Jan. 2018, which is incorporated by reference in its entirety.

TECHNICAL FIELD

The present disclosure is generally related to sensor housing design and, more particularly, to a sensor housing design for radar sensors.

BACKGROUND

Unless otherwise indicated herein, approaches described in this section are not prior art to the claims listed below and are not admitted as prior art by inclusion in this section.

Traditionally, the radiation pattern of a radar sensor is affected by the design of its corresponding antenna and antenna cover (also known as "radome"). In the context of automotive radars, the radome is typically designed as part of the radar sensor housing. However, for some applications (e.g., automotive applications), there needs a design that is waterproof and can provide thermal dissipation while minimizing multi-path reflection from one or more objects at the back-end of the radar sensor.

SUMMARY

The following summary is illustrative only and is not intended to be limiting in any way. That is, the following summary is provided to introduce concepts, highlights, benefits and advantages of the novel and non-obvious techniques described herein. Select implementations are further described below in the detailed description. Thus, the following summary is not intended to identify essential features of the claimed subject matter, nor is it intended for use in determining the scope of the claimed subject matter.

An objective of the present disclosure is to propose solutions, schemes, concepts and apparatus pertaining to radar sensor (e.g., mmWave sensor) housing designs.

In one aspect, an apparatus may include a radar sensor, a printed circuit board (PCB), a radome and a PCB holder. The radar sensor may be capable of emitting a radio wave. The PCB may have a first side and a second side opposite the first side with the radar sensor mounted on the first side thereof to form a PCB assembly (PCBA). The radome may include a cavity in which the PCBA is disposed. The PCB holder may be disposed along a circumference of an inner wall of the radome, and the PCB holder may be configured to hold the PCBA such that a distance between an inner surface of the radome and a side of the radar sensor facing the inner surface of the radome is proportional to half wavelength of the radio wave.

In one aspect, an apparatus may include a radar sensor, a PCB, an enclosure and a potting glue. The radar sensor may be capable of emitting a radio wave. The PCB may have a first side and a second side opposite the first side with the radar sensor mounted on the first side thereof to form a PCBA. The enclosure may include a cavity that encloses the PCBA therein with the PCBA dissecting the cavity into a first space defined at least by the enclosure and a first side of the PCB and a second space defined at least by the enclosure and the second side of the PCB. The potting glue may be filled in the second space, the potting glue capable of at least one of a plurality of functions including a waterproof function to prevent a liquid to reach from the second side of the PCB to the first side of the PCB, a thermal dissipation function, and an electromagnetic (EM) wave absorption function.

In one aspect, an apparatus may include a radar sensor, a PCB, an enclosure, a metal shield and a thermal dissipation material. The radar sensor may be capable of emitting a radio wave. The PCB may have a first side and a second side opposite the first side with the radar sensor mounted on the first side thereof to form a PCBA. The enclosure may include a cavity that encloses the PCBA therein with the PCBA dissecting the cavity into a first space defined at least by the enclosure and a first side of the PCB and a second space defined at least by the enclosure and the second side of the PCB. The metal shield may be disposed in the second space between the enclosure and the PCBA, and the metal shield may be capable of reducing multi-path reflection from one or more objects facing the second side of the PCB. The thermal dissipation material may be filled in a space between the metal shield and the enclosure. The thermal dissipation material and the metal shield together may be capable of a plurality of functions including a thermal dissipation function and an EM wave absorption function.

BRIEF DESCRIPTION OF THE DRAWINGS

The accompanying drawings are included to provide a further understanding of the disclosure, and are incorporated in and constitute a part of the present disclosure. The drawings illustrate implementations of the disclosure and, together with the description, serve to explain the principles of the disclosure. It is appreciable that the drawings are not necessarily in scale as some components may be shown to be out of proportion than the size in actual implementation in order to clearly illustrate the concept of the present disclosure.

FIG. 8 is a diagram of an example radar sensor housing package in accordance with an implementation of the present disclosure.

DETAILED DESCRIPTION OF PREFERRED IMPLEMENTATIONS

Detailed embodiments and implementations of the claimed subject matters are disclosed herein. However, it shall be understood that the disclosed embodiments and implementations are merely illustrative of the claimed subject matters which may be embodied in various forms. The present disclosure may, however, be embodied in many different forms and should not be construed as limited to the exemplary embodiments and implementations set forth herein. Rather, these exemplary embodiments and implementations are provided so that description of the present disclosure is thorough and complete and will fully convey the scope of the present disclosure to those skilled in the art. In the description below, details of well-known features and techniques may be omitted to avoid unnecessarily obscuring the presented embodiments and implementations.

Overview

Under various designs in accordance with the present disclosure, a sensor housing may include a radome, a printed circuit board (PCB) on which one or more radar sensors may be installed or otherwise mounted, a PCB holder, a metal shield and a housing. To eliminate unwanted effect on the radiation pattern due to sensor housing and vehicle bumper (in automobile applications), a free space in front of the antenna and a distance between the antenna and radome may be controlled to be at a specific value (e.g., proportional to half wavelength). Moreover, a thickness of the sensor housing may be within a specific range depending on material property of the sensor housing, which may be part of the vehicle bumper to simply the structure. Additionally, a potting glue may be utilized with multiple functions including, for example, waterproofing, heat dissipation, and electromagnetic (EM) wave absorption. Alternatively, the functions of waterproofing, heat dissipation, and EM wave absorption may be provided by the user of a metal shield and a thermal dissipation material with the radome and housing sealed by an ultrasonic or laser welding process. In various designs in accordance with the present disclosure, the metal shield may be placed behind the PCB to avoid multi-path reflection from back-end obstacle(s)/object(s). In some designs, a metal back cover may be utilized for the sensor housing. Furthermore, a metal structure may be utilized in the antenna cover to shape a far-field antenna pattern.

Illustrative Implementations

Figure 1:
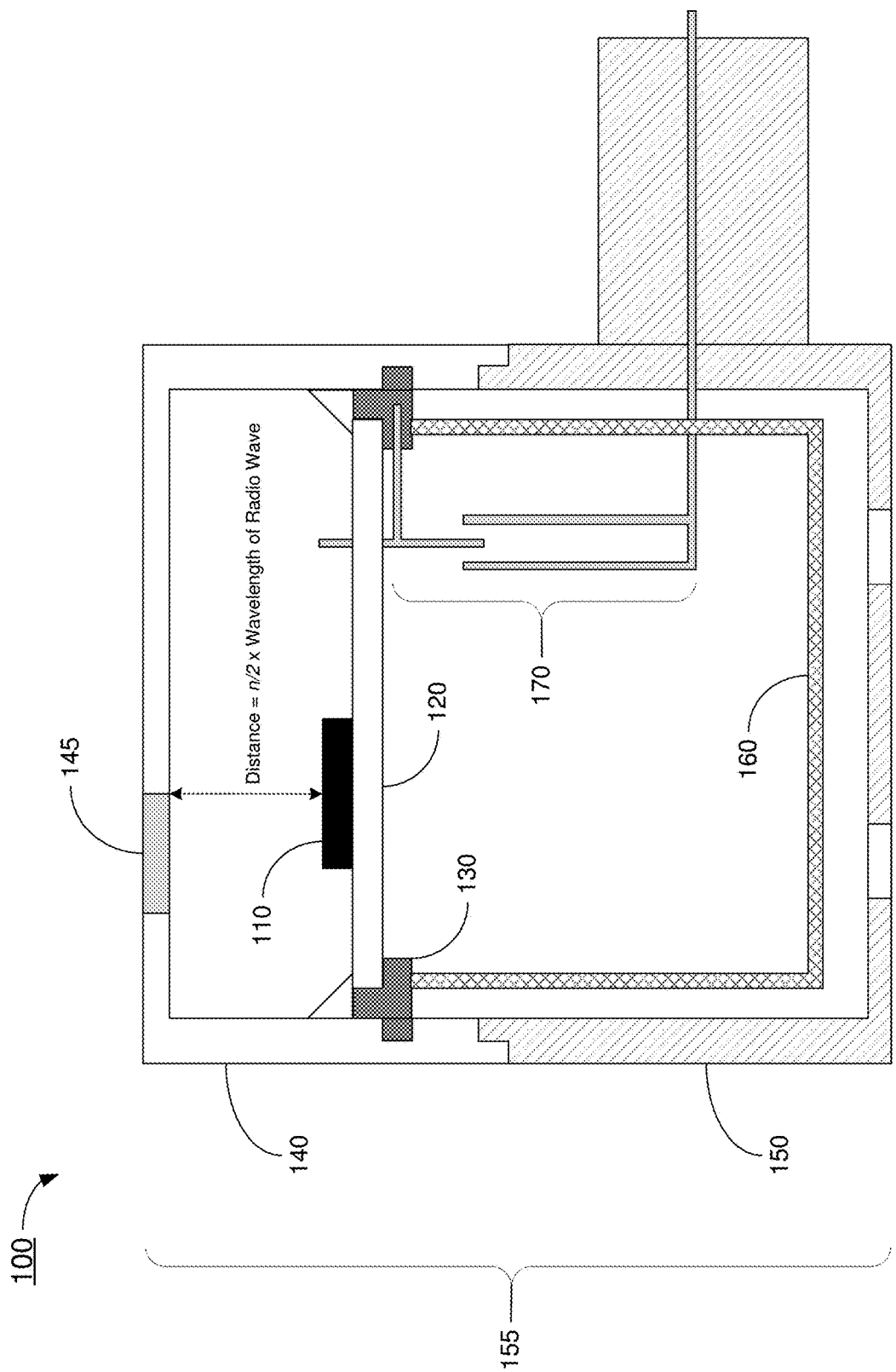
FIG. 1 is a diagram of an example radar sensor housing package in accordance with an implementation of the present disclosure.
Figure 2:
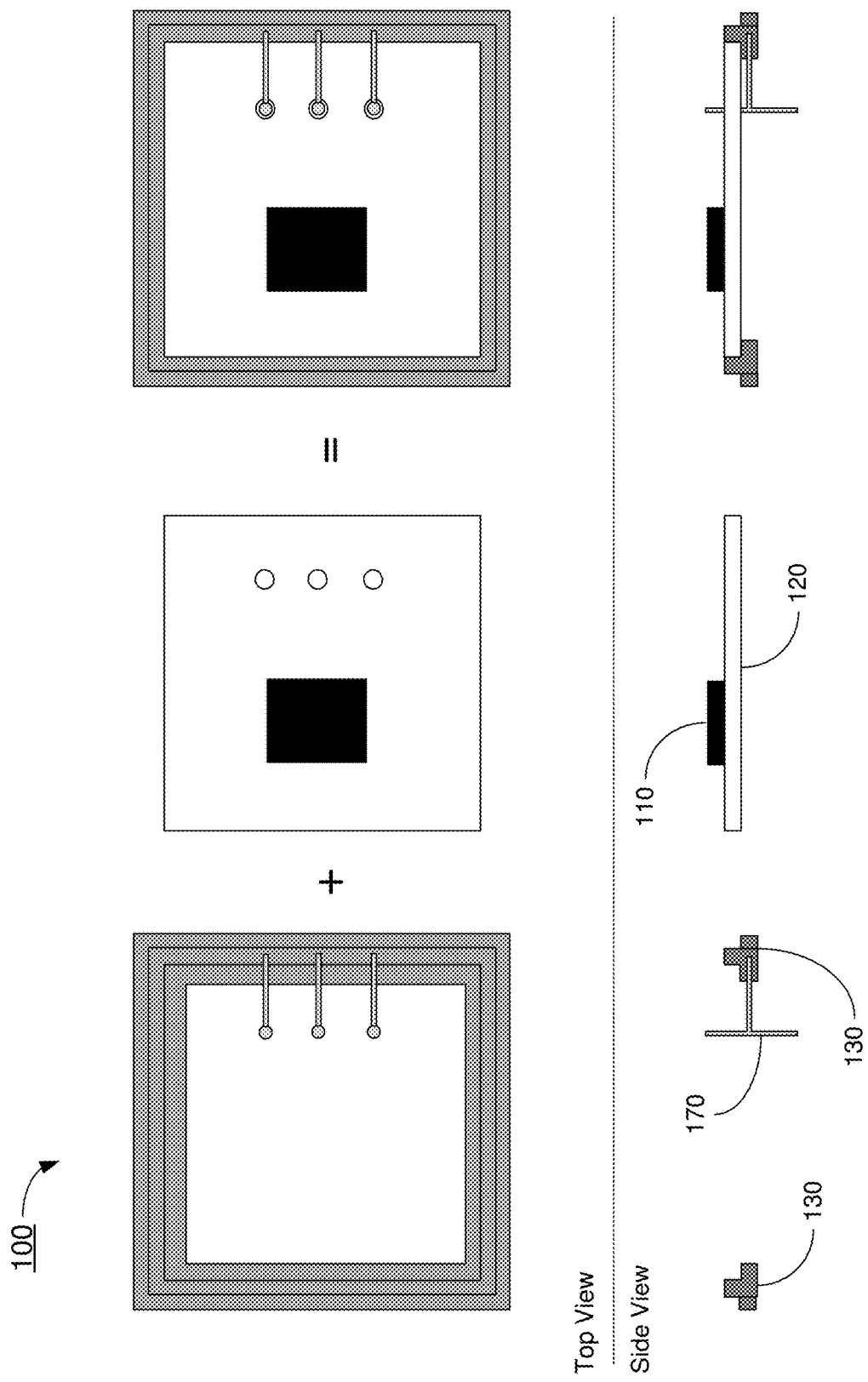
FIG. 2 is a diagram of an assembly of some components of an example radar sensor housing package in accordance with an implementation of the present disclosure.
Figure 3:
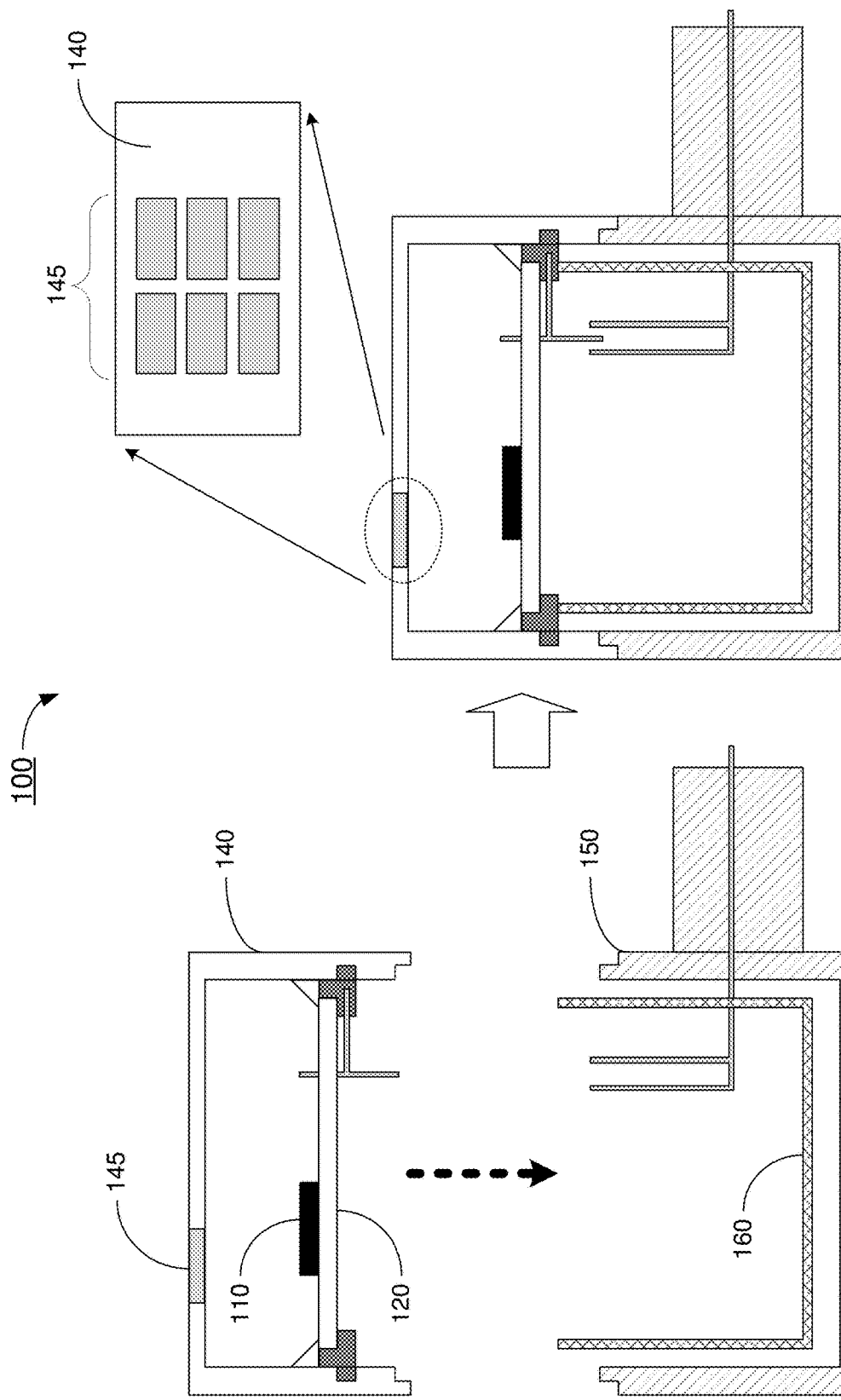
FIG. 3 is a diagram of an assembly of some components of an example radar sensor housing package in accordance with an implementation of the present disclosure.

FIG. 1 illustrates an example radar sensor housing package 100 in accordance with an implementation of the present disclosure. FIG. 2 illustrates an assembly of some components of an example radar sensor housing package 100 in accordance with an implementation of the present disclosure. FIG. 3 illustrates an assembly of some components of an example radar sensor housing package 100 in accordance with an implementation of the present disclosure. Description of radar sensor housing package 100 below is provided with reference to FIG. 1-FIG. 3.

Referring to FIG. 1, FIG. 2 and FIG. 3, radar sensor housing package 100 may include a radar sensor (e.g., mmWave sensor) 110, a PCB 120 and an enclosure 155. Radar sensor 110 may be capable of emitting a radio wave (e.g., EM waves in the millimeter range at 60-6 GHz and/or 76-81 GHz range(s)). PCB 120 may have a first side (e.g., the side facing up in FIG. 1) and a second side (e.g., the side facing down in FIG. 1) opposite the first side, with radar sensor 110 mounted on the first side thereof such that radar sensor 110 and PCB 120 together form a PCB assembly (PCBA). In some implementations, PCB 120 may be configured with one or more through holes through which one or more electrical conductors 170 may traverse from the second side of PCB 120 to the first side of PCB 120 to electrically connect to radar sensor 110.

Enclosure 155 may have a cavity that encloses the PCBA therein with the PCBA dissecting the cavity into a first space defined at least by enclosure 155 and a first side of PCB 120 (e.g., the space in enclosure 155 above PCB 120 in FIG. 1) and a second space defined at least by enclosure 155 and the second side of PCB 120 (e.g., the space in enclosure 155 below PCB 120 in FIG. 1). In some implementations, enclosure 155 may include a radome 140 with a first cavity and a housing 150 with a second cavity such that, when radome 140 and housing 150 are mated together to form enclosure 155, the PCBA including radar sensor 110 and PCB 120 may be contained within enclosure 155. For instance, enclosure 155 may be formed by sealing radome 140 and housing 150 together by ultrasound or laser welding to provide a waterproof function to prevent a liquid or moisture from entering enclosure 155 from outside of enclosure 155. In some implementations, a height of where radome 140 and housing 150 are mated or otherwise sealed together may be lower than the second side of PCB 120 (e.g., below the second side of PCB 120 as shown in FIG. 1) to enhance the waterproof function.

As shown in FIG. 1, enclosure 155 may also include a PCB holder 130 along a circumference of an inner wall of radome 140. In some implementations, for cost effective purposes (e.g., lower manufacturing cost), PCB holder 130 and radome 140 may be integral parts of a monolithic antenna cover. Moreover, PCB holder 130 may be configured to hold the PCBA such that a distance between an inner surface of radome 140 and a side of radar sensor 110 facing the inner surface of radome 140 (e.g., the top side of radar sensor 110 in FIG. 1) is proportional to half wavelength of the radio wave emitted by radar sensor 110. For instance, the distance may be mathematically expressed as distance=n/2×wavelength of radio wave, with n≥1. In some implementations, n may be equal to 2 in that the distance between the inner surface of radome 140 and the side of radar sensor 110 facing the inner surface of radome 140 (e.g., the top side of radar sensor 110 in FIG. 1) is equal to one wavelength of the radio wave. Thus, another benefit of having PCB holder 130 and radome 140 being integral parts of a monolithic antenna cover is that errors during assembly of parts may be prevented or otherwise minimized, thereby more precisely controlling the distance between radar sensor 110 and radome 140 to be at a desired or otherwise predefined value (e.g., one wavelength of the radio wave). In some implementations, the mechanical structure of radome 140 may be designed with means for extension and contraction such that the distance may be controlled (e.g., increased and decreased). Advantageously, by controlling or otherwise setting the distance between radar sensor 110 and radome 140 be proportional to half wavelength of the radio wave (and in a preferred embodiment, at one wavelength of the radio wave), quiet day curve (QDC) and far-field antenna gain performance may be optimized. It is noteworthy that, by controlling or setting such distance to be at a desired or otherwise predefined value, an amount of energy of the radio wave reflected back by radome 140 may be minimized.

Additionally, as shown in FIG. 1, FIG. 2 and FIG. 3, radar sensor housing package 100 may further include a metal shield 160 disposed between housing 150 and the PCBA. Metal shield 160 may be capable of reducing multi-path reflection from one or more objects facing the second side of PCB 120 (e.g., a bumper of an automobile in an automotive application).

Moreover, as shown in FIG. 1, FIG. 2 and FIG. 3, radar sensor housing package 100 may further include a metal structure 145 disposed on radome 140. In particular, metal structure 145 may be in a path of radiation of the radio wave emitted from radar sensor 110 such that metal structure 145 shapes a far-field antenna pattern of the radio wave. In some implementations, as shown in FIG. 3, metal structure 145 may include one or more discrete pieces of metal mounted on or otherwise embedded in radome 140 (e.g., by injection molding).

An example assembly of radar sensor housing package 100 is shown in FIG. 2 and FIG. 3. As would be appreciated by those with ordinary skill in the art, one benefit provided by various designs in accordance with the present disclosure is the simplicity and relative ease in the assembly process of radar sensor housing package 100. Compared to the assembly process of conventional radar sensor housing packages, it is believed that the assembly process of radar sensor housing package 100 improves the precision in various dimensions of radar sensor housing package 100, thereby contributing to enhancement in overall system performance.

Figure 4:
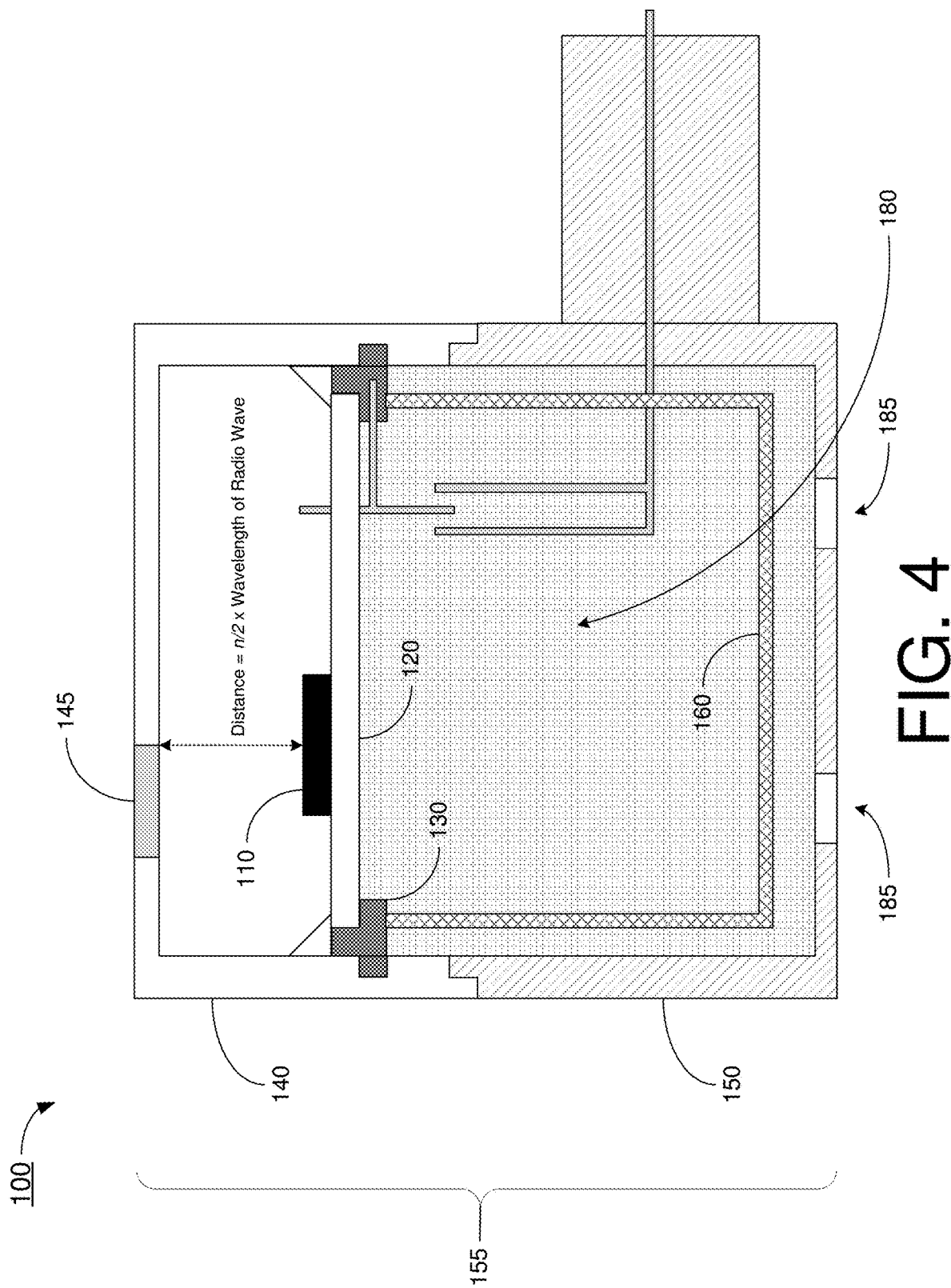
FIG. 4 is a diagram of an example radar sensor housing package filled with a potting glue in accordance with an implementation of the present disclosure.

FIG. 4 illustrates an example radar sensor housing package 100 filled with a potting glue in accordance with an implementation of the present disclosure. Referring to FIG. 4, in some implementations, a potting glue 180 may be filled in a space defined by at least housing 150, PCB holder 130 and the second side of PCB 120. Potting glue 180 may be capable of at least one of a plurality of functions, including: (1) a waterproof function to prevent a liquid and/or moisture to reach from the second side of PCB 120 to the first side of PCB 120, (2) a thermal dissipation function to dissipate heat generated by the PCBA (e.g., especially by radar sensor 110), and (3) an EM wave absorption function to absorb at least some EM energy of the radio wave emitted by radar sensor 110. Accordingly, housing 150 may include one or more vent holes 185 to allow filling of potting glue 180 and/or venting of air trapped inside enclosure 155. In some implementations, PCB holder 130 may connect PCB 120 to radome 140 and/or housing 150 as well as external electrical connector(s). PCB holder 130 may also function as a glue stopper to prevent potting glue 180 from leaking to the first side of PCB 120 to reach and contact radar sensor 110. Advantageously, with potting glue 180 disposed on the back end of PCB 120 (e.g., below PCB 120 as shown in FIG. 4), the design allows ease in changing different connector types of electrical conductors 170 (which enter enclosure 155 through housing 150) with no need to change radome 140. It is noteworthy that either of metal shield 160 and potting glue 180 may be optionally. That is, in some implementations, radar sensor housing package 100 may include metal shield 160 but not potting glue 180; in some alternative implementations, radar sensor housing package 100 may include potting glue 180 but not metal shield 160; and in some other implementations, radar sensor housing package 100 may include both metal shield 160 and potting glue 180 (as shown in FIG. 4).

Figure 5:
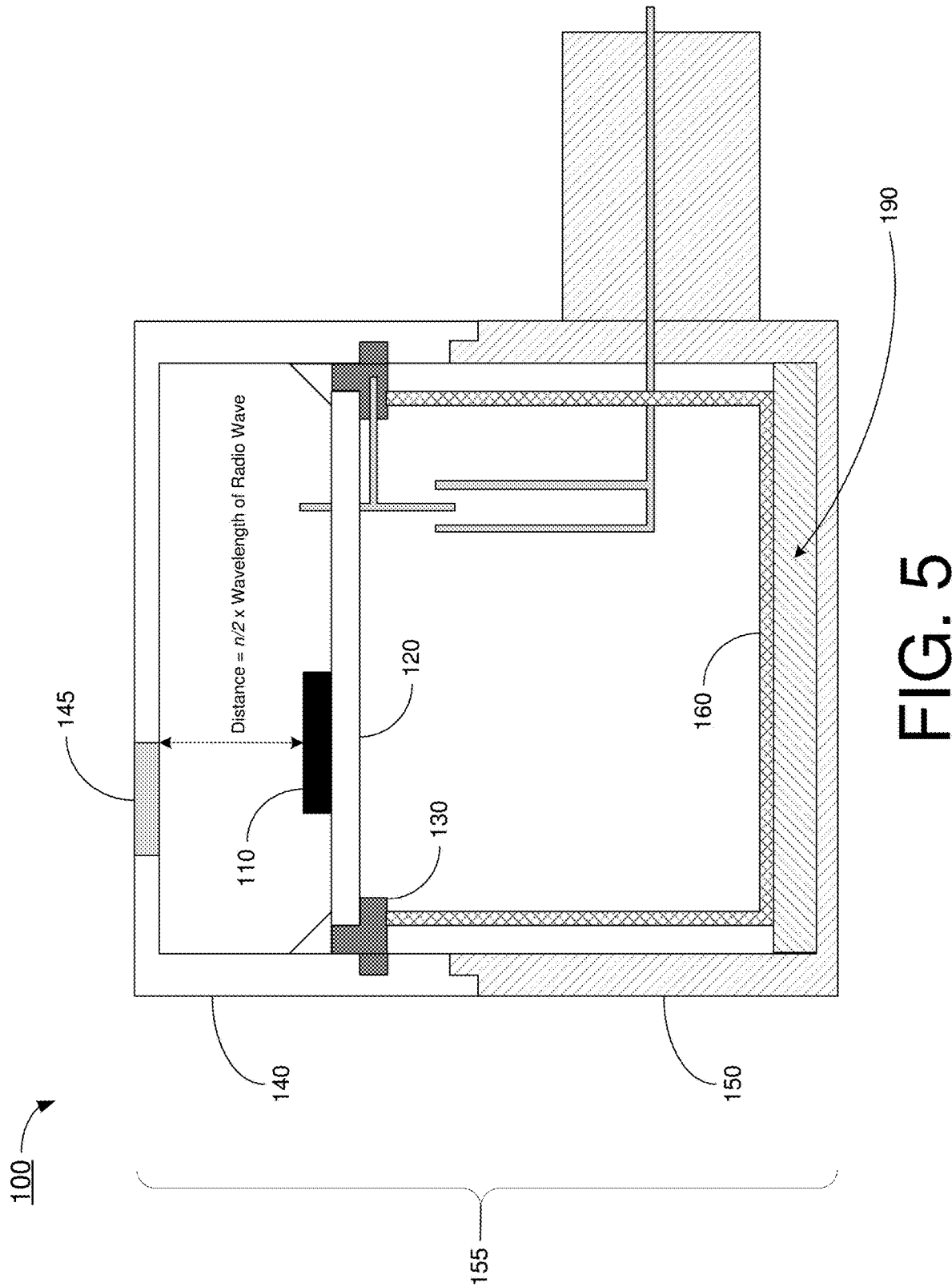
FIG. 5 is a diagram of an example radar sensor housing package including a thermal dissipation material in accordance with an implementation of the present disclosure.

FIG. 5 illustrates an example radar sensor housing package 100 including a thermal dissipation material in accordance with an implementation of the present disclosure. Referring to FIG. 5, in some implementations, a thermal dissipation material 190 may be filled in a space defined by at least metal shield 160 and housing 150. Thermal dissipation material 190 and metal shield 160 together may be capable of a plurality of functions, including: (1) a thermal dissipation function to dissipate heat generated by the PCBA (e.g., especially by radar sensor 110), and (2) an EM wave absorption function to absorb at least some EM energy of the radio wave emitted by radar sensor 110.

Figure 6:
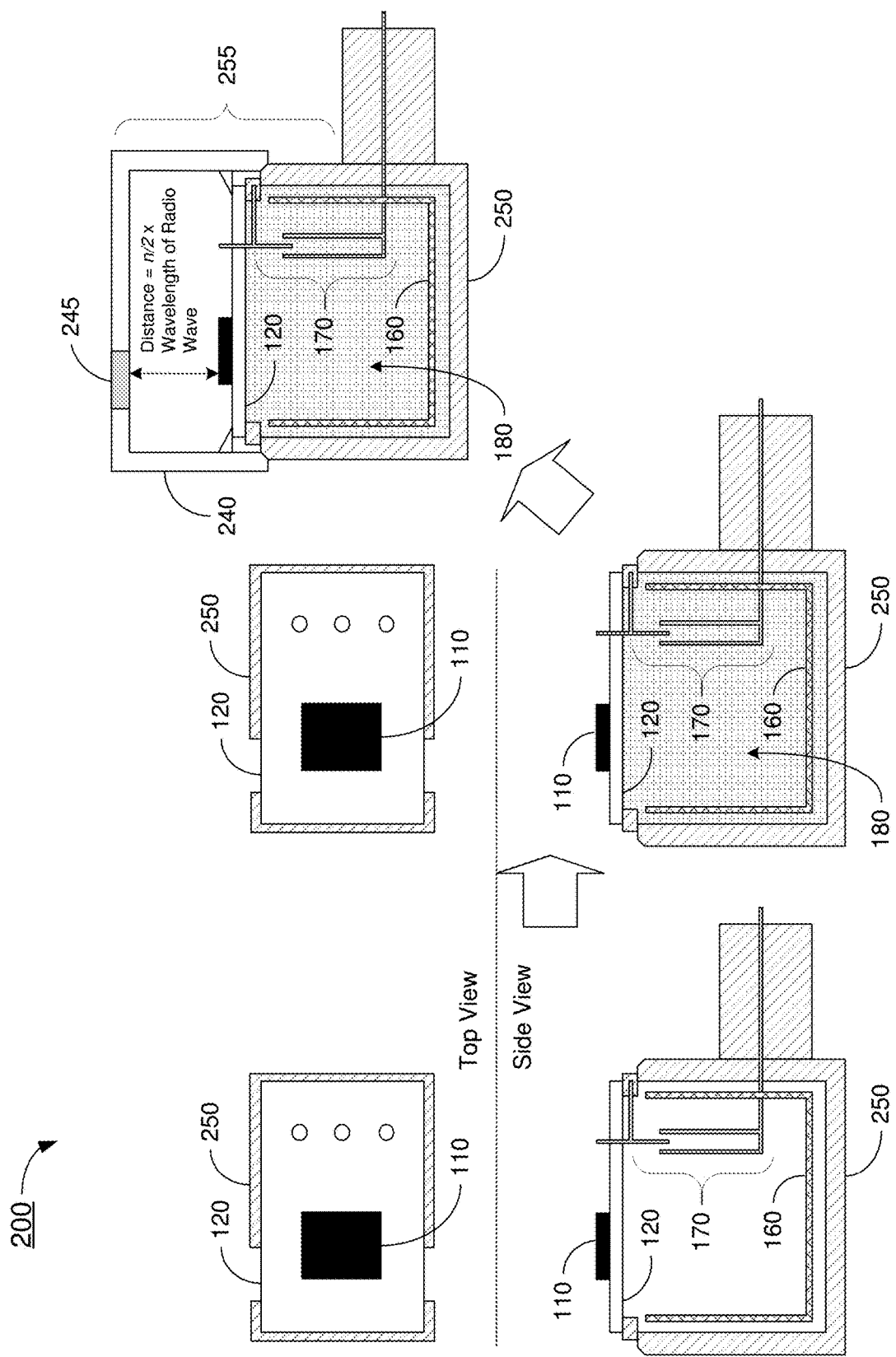
FIG. 6 is a diagram of an example radar sensor housing package in accordance with an implementation of the present disclosure.
Figure 7:
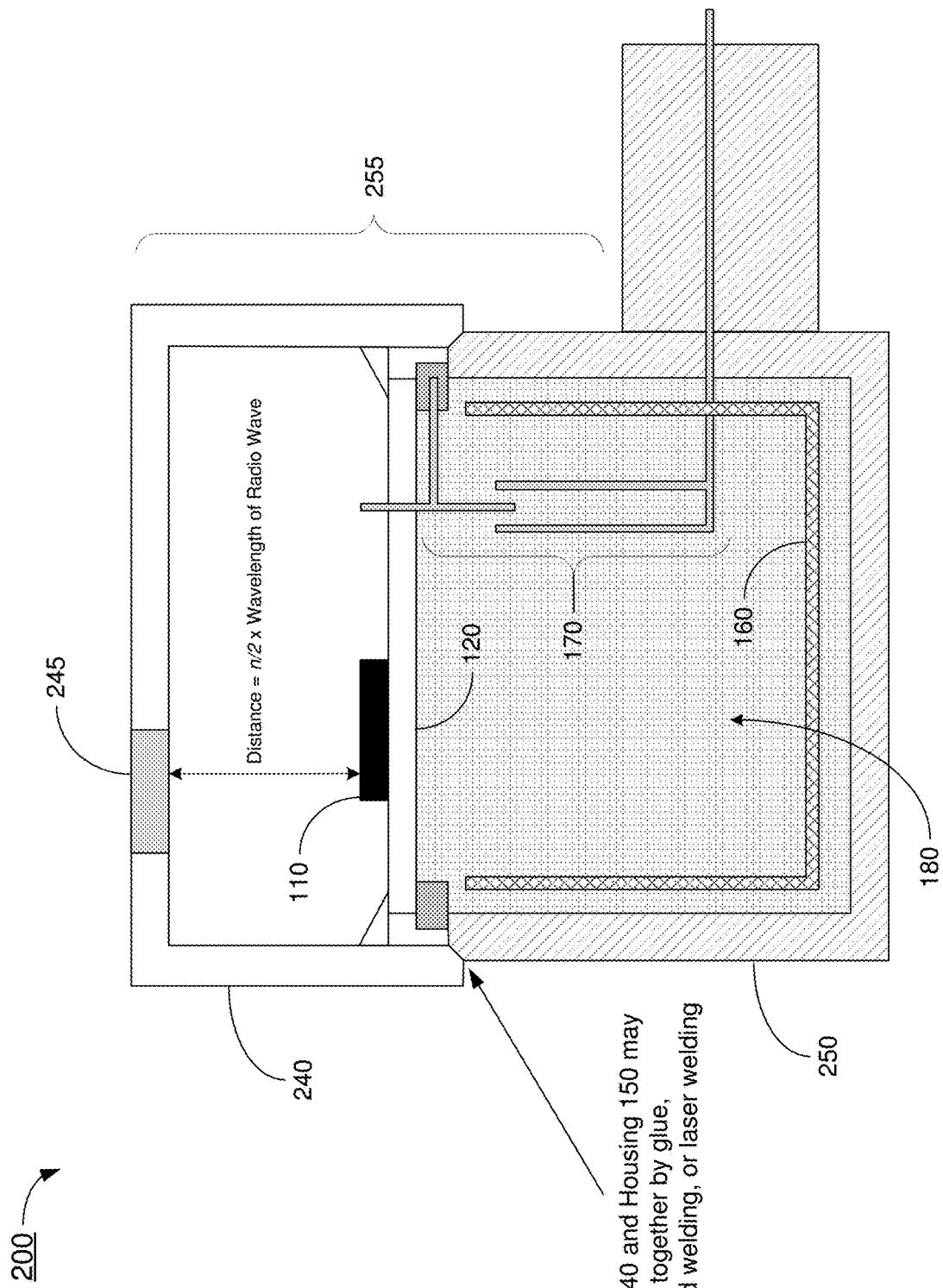
FIG. 7 is a diagram of an example radar sensor housing package in accordance with an implementation of the present disclosure.

Each of FIG. 6 and FIG. 7 illustrates an example radar sensor housing package 200 in accordance with an implementation of the present disclosure. Referring to FIG. 6, radar sensor housing package 200 may include a radar sensor (e.g., mmWave sensor) 110, a PCB 120, an enclosure 255, a metal shield 160, one or more electrical conductors 170, and a potting glue 180. Enclosure 255 may include a radome 240 and a housing 250.

As shown in FIG. 6, radar sensor housing package 200 may differ from radar sensor housing package 100 in that, in radar sensor housing package 200, PCB 120 may be directly placed or otherwise disposed on housing 250 (e.g., a rim of housing 250). During assembly, after PCB 120 is placed on housing 250, potting glue 180 may be filled into a cavity in housing 250. On the other hand, similar to the design of radar sensor housing package 100, housing 250 may be configured to hold the PCBA (including PCB 120 and radar sensor 110) such that a distance between an inner surface of radome 240 and a side of radar sensor 110 facing the inner surface of radome 240 (e.g., the top side of radar sensor 110 in FIG. 6) is proportional to half wavelength of the radio wave emitted by radar sensor 110. For instance, the distance may be mathematically expressed as distance=n/2×wavelength of radio wave, with n≥1. In some implementations, n may be equal to 2 in that the distance between the inner surface of radome 240 and the side of radar sensor 110 facing the inner surface of radome 240 (e.g., the top side of radar sensor 110 in FIG. 6) is equal to one wavelength of the radio wave.

As shown in FIG. 7, radome 240 and housing 250 may be sealed together by glue, ultrasound welding, or laser welding. In some implementations, a metal structure 245 may be disposed on radome 240. In particular, metal structure 245 may be in a path of radiation of a radio wave emitted from radar sensor 110 such that metal structure 245 shapes a far-field antenna pattern of the radio wave. In some implementations, metal structure 245 may include one or more discrete pieces of metal mounted on or otherwise embedded in radome 240 (e.g., by injection molding).

FIG. 8 illustrates an example radar sensor housing package 300 in accordance with an implementation of the present disclosure. Referring to FIG. 8, radar sensor housing package 300 may include a radar sensor (e.g., mmWave sensor) 110, a PCB 120, a PCB holder 330, a housing 350, a metal shield 160, one or more electrical conductors 170, and a potting glue 180.

As shown in FIG. 8, PCB holder 330 may be configured with one or more open holes along a perimeter thereof. During assembly, PCB 120 may be placed or otherwise disposed on PCB holder 330, and then potting glue 180 may be filled into a cavity in housing 350. In particular, potting glue 180 may be dispensed through the one or more open holes of PCB holder 330.

Feature Highlight

In view of the above, a select number of illustrative and non-limiting designs are highlighted below.

In a first design, an apparatus (as an mmWave sensor housing) may include a radar sensor, a printed circuit board (PCB), a radome and a PCB holder. The radar sensor may be capable of emitting a radio wave. The PCB may have a first side and a second side opposite the first side with the radar sensor mounted on the first side thereof to form a PCB assembly (PCBA). The radome may include a cavity in which the PCBA is disposed. The PCB holder may be disposed along a circumference of an inner wall of the radome, and the PCB holder may be configured to hold the PCBA such that a distance between an inner surface of the radome and a side of the radar sensor facing the inner surface of the radome is proportional to half wavelength of the radio wave.

In the first design, the distance may be equal to one wavelength of the radio wave.

In the first design, the PCB holder and the radome may be integral parts of a monolithic antenna cover.

In the first design, the PCB may be configured with one or more through holes through which one or more electrical conductors traverse from the second side of the PCB to electrically connect to the radar sensor.

In the first design, the apparatus may also include a housing and a metal shield. The housing may have a cavity such that the housing and the radome are mated together to form an enclosure with the PCBA and PCB holder contained therein. The metal shield may be disposed between the housing and the PCBA, and the metal shield may be capable of reducing multi-path reflection from one or more objects facing the second side of the PCB.

In the first design, the radome and the housing may be sealed together by ultrasonic or laser welding to provide a waterproof function to prevent a liquid from entering the enclosure from outside of the enclosure.

In the first design, the apparatus may also include a potting glue filled in a space defined by at least the housing, the PCB holder and the second side of the PCB. The potting glue may be capable of at least one of a plurality of functions including: (1) a waterproof function to prevent a liquid to reach from the second side of the PCB to the first side of the PCB, (2) a thermal dissipation function, and (3) an EM wave absorption function.

In the first design, the apparatus may further include a thermal dissipation material filled in a space defined by at least the metal shield and the housing. The thermal dissipation material and the metal shield together may be capable of a plurality of functions including: (1) a thermal dissipation function, and (2) an EM wave absorption function.

In the first design, the apparatus may further include a metal structure disposed on the radome and in a path of radiation of the radio wave from the radar sensor such that the metal structure shapes a far-field antenna pattern. In some implementations, the metal structure may include one or more discrete pieces of metal mounted on or embedded in the radome.

In a second design, an apparatus (as an mmWave sensor housing) may include a radar sensor, a PCB, an enclosure and a potting glue. The radar sensor may be capable of emitting a radio wave. The PCB may have a first side and a second side opposite the first side with the radar sensor mounted on the first side thereof to form a PCBA. The enclosure may include a cavity that encloses the PCBA therein with the PCBA dissecting the cavity into a first space defined at least by the enclosure and a first side of the PCB and a second space defined at least by the enclosure and the second side of the PCB. The potting glue may be filled in the second space, the potting glue capable of at least one of a plurality of functions including a waterproof function to prevent a liquid to reach from the second side of the PCB to the first side of the PCB, a thermal dissipation function, and an EM wave absorption function.

In the second design, a distance between an inner surface of the enclosure and a side of the radar sensor facing the inner surface of the enclosure may be proportional to half wavelength of the radio wave. In some implementations, the distance may be equal to one wavelength of the radio wave.

In the second design, the PCB may be configured with one or more through holes through which one or more electrical conductors traverse from the second side of the PCB to electrically connect to the radar sensor.

In the second design, the apparatus may further include a metal shield disposed in the second space. The metal shield may be capable of reducing multi-path reflection from one or more objects facing the second side of the PCB.

In the second design, the apparatus may further include a metal structure mounted on or embedded in the enclosure and in a path of radiation of the radio wave from the radar sensor such that the metal structure shapes a far-field antenna pattern.

In a third design, an apparatus (as an mmWave sensor housing) may include a radar sensor, a PCB, an enclosure, a metal shield and a thermal dissipation material. The radar sensor may be capable of emitting a radio wave. The PCB may have a first side and a second side opposite the first side with the radar sensor mounted on the first side thereof to form a PCBA. The enclosure may include a cavity that encloses the PCBA therein with the PCBA dissecting the cavity into a first space defined at least by the enclosure and a first side of the PCB and a second space defined at least by the enclosure and the second side of the PCB. The metal shield may be disposed in the second space between the enclosure and the PCBA, and the metal shield may be capable of reducing multi-path reflection from one or more objects facing the second side of the PCB. The thermal dissipation material may be filled in a space between the metal shield and the enclosure. The thermal dissipation material and the metal shield together may be capable of a plurality of functions including a thermal dissipation function and an EM wave absorption function.

In the third design, a distance between an inner surface of the enclosure and a side of the radar sensor facing the inner surface of the enclosure may be proportional to half wavelength of the radio wave. In some implementations, the distance is equal to one wavelength of the radio wave.

In the third design, the apparatus may further include a metal structure mounted on or embedded in the enclosure and in a path of radiation of the radio wave from the radar sensor such that the metal structure shapes a far-field antenna pattern.

Additional Notes

The herein-described subject matter sometimes illustrates different components contained within, or connected with, different other components. It is to be understood that such depicted architectures are merely examples, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

Further, with respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

Moreover, it will be understood by those skilled in the art that, in general, terms used herein, and especially in the appended claims, e.g., bodies of the appended claims, are generally intended as "open" terms, e.g., the term "including" should be interpreted as "including but not limited to," the term "having" should be interpreted as "having at least," the term "includes" should be interpreted as "includes but is not limited to," etc. It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to implementations containing only one such recitation, even when the same claim includes the introductory phrases "one or more" or "at least one" and indefinite articles such as "a" or "an," e.g., "a" and/or "an" should be interpreted to mean "at least one" or "one or more;" the same holds true for the use of definite articles used to introduce claim recitations. In addition, even if a specific number of an introduced claim recitation is explicitly recited, those skilled in the art will recognize that such recitation should be interpreted to mean at least the recited number, e.g., the bare recitation of "two recitations," without other modifiers, means at least two recitations, or two or more recitations. Furthermore, in those instances where a convention analogous to "at least one of A, B, and C, etc." is used, in general such a construction is intended in the sense one having skill in the art would understand the convention, e.g., "a system having at least one of A, B, and C" would include but not be limited to systems that have A alone, B alone, C alone, A and B together, A and C together, B and C together, and/or A, B, and C together, etc. In those instances where a convention analogous to "at least one of A, B, or C, etc." is used, in general such a construction is intended in the sense one having skill in the art would understand the convention, e.g., "a system having at least one of A, B, or C" would include but not be limited to systems that have A alone, B alone, C alone, A and B together, A and C together, B and C together, and/or A, B, and C together, etc. It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

From the foregoing, it will be appreciated that various implementations of the present disclosure have been described herein for purposes of illustration, and that various modifications may be made without departing from the scope and spirit of the present disclosure. Accordingly, the various implementations disclosed herein are not intended to be limiting, with the true scope and spirit being indicated by the following claims.

What is claimed is:

1. An apparatus, comprising:
   a radar sensor capable of emitting a radio wave;
   a printed circuit board (PCB) having a first side and a second side opposite the first side with the radar sensor mounted on the first side thereof to form a PCB assembly (PCBA);
   a radome with a cavity in which the PCBA is disposed;
   a solid metal structure mounted on or embedded in the radome and in a path of radiation of the radio wave emitted from the radar sensor, the metal structure configured to shape a far-field antenna pattern of the radio wave;
   a PCB holder along a circumference of an inner wall of the radome, the PCB holder holding the PCBA in place;
   a housing with a cavity such that the housing and the radome are mated together to form an enclosure with the PCBA and PCB holder contained therein, the enclosure comprising:
   a first space defined by at least the radome and the first side of the PCB; and
   a second space defined by at least the housing, the PCB holder and the second side of the PCB which is opposite the first side of the PCB on which the radar sensor is mounted; and
   a potting glue filled in the second space,
   wherein the PCB holder functions as a glue stopper to prevent the potting glue from entering the first space in which the radar sensor is located.

2. The apparatus of claim 1, wherein the PCB holder and the radome are integral parts of a monolithic antenna cover.

3. The apparatus of claim 1, wherein the PCB is configured with one or more through holes through which one or more electrical conductors traverse from the second side of the PCB to electrically connect to the radar sensor.

4. The apparatus of claim 1, further comprising:
   a metal shield disposed between the housing and the PCBA, the metal shield capable of reducing multi-path reflection from one or more objects facing the second side of the PCB.

5. The apparatus of claim 4, wherein the radome and the housing are sealed together by ultrasonic or laser welding to provide a waterproof function to prevent a liquid from entering the enclosure from outside of the enclosure.

6. The apparatus of claim 4, wherein the potting glue is configured to provide at least one of a plurality of functions comprising:
   a waterproof function to prevent a liquid to reach from the second side of the PCB to the first side of the PCB;
   a thermal dissipation function; and
   an electromagnetic (EM) wave absorption function.

7. The apparatus of claim 4, further comprising:
   a thermal dissipation material filled in a space defined by at least the metal shield and the housing, the thermal dissipation material and the metal shield together capable of a plurality of functions comprising:
   a thermal dissipation function; and
   an electromagnetic (EM) wave absorption function.

8. The apparatus of claim 1, wherein the metal structure comprises one or more discrete pieces of metal mounted on or embedded in the radome.

9. An apparatus, comprising:
   a radar sensor capable of emitting a radio wave;
   a printed circuit board (PCB) having a first side and a second side opposite the first side with the radar sensor mounted on the first side thereof to form a PCB assembly (PCBA);

an enclosure with a cavity that encloses the PCBA therein with the PCBA dissecting the cavity into:

a first space defined at least by the enclosure and the first side of the PCB on which the radar sensor is mounted, and a second space defined at least by the enclosure and the second side of the PCB; and a solid metal structure mounted on or embedded in the enclosure and in a path of radiation of the radio wave emitted from the radar sensor, the metal structure configured to shape a far-field antenna pattern of the radio wave;

a potting glue filled in the second space, the potting glue capable of at least one of a plurality of functions comprising:

a waterproof function to prevent a liquid to reach from the second side of the PCB to the first side of the PCB;

a thermal dissipation function; and an electromagnetic (EM) wave absorption function; and a PCB holder along a circumference of an inner wall of the enclosure, the PCB holder holding the PCBA in place and functioning as a glue stopper to prevent the potting glue from entering the first space in which the radar sensor is located.

10. The apparatus of claim 9, wherein the PCB is configured with one or more through holes through which one or more electrical conductors traverse from the second side of the PCB to electrically connect to the radar sensor.

11. The apparatus of claim 9, further comprising:

a metal shield disposed in the second space, the metal shield capable of reducing multi-path reflection from one or more objects facing the second side of the PCB.

12. An apparatus, comprising:

a radar sensor capable of emitting a radio wave;

a printed circuit board (PCB) having a first side and a second side opposite the first side with the radar sensor mounted on the first side thereof to form a PCB assembly (PCBA);

an enclosure with a cavity that encloses the PCBA therein with the PCBA dissecting the cavity into:

a first space defined at least by the enclosure and the first side of the PCB, and a second space defined at least by the enclosure and the second side of the PCB on which the radar sensor is mounted;

a solid metal structure mounted on or embedded in the enclosure and in a path of radiation of the radio wave emitted from the radar sensor, the metal structure configured to shape a far-field antenna pattern of the radio wave;

a metal shield disposed in the second space between the enclosure and the PCBA, the metal shield capable of reducing multi-path reflection from one or more objects facing the second side of the PCB;

a potting glue filled in the second space; and a PCB holder along a circumference of an inner wall of the enclosure, the PCB holder holding the PCBA in place and functioning as a glue stopper to prevent the potting glue from entering the first space in which the radar sensor is located.

13. The apparatus of claim 12, further comprising:

a thermal dissipation material filled in a space between the metal shield and the enclosure, the thermal dissipation material and the metal shield together capable of a plurality of functions comprising:

a thermal dissipation function; and an electromagnetic (EM) wave absorption function.

\* \* \* \* \*